US008779817B2

(12) United States Patent
 Jakobsson

(10) Patent No.: US 8,779,817 B2
(45) Date of Patent: Jul. 15, 2014

(54) SPUR SUPPRESSION IN A PHASE-LOCKED LOOP

(71) Applicant: Huawei Technologies Co., Ltd., Shenzhen (CN)

(72) Inventor: Anders Jakobsson, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/093,999

(22) Filed: Dec. 2, 2013

(65) Prior Publication Data

US 2014/0091844 A1    Apr. 3, 2014

Related U.S. Application Data

(63) Continuation of application No. PCT/CN2011/075095, filed on Jun. 1, 2011.

(51) Int. Cl.
 *H03L 7/06* (2006.01)
 *H03L 7/08* (2006.01)
 *H03L 7/197* (2006.01)

(52) U.S. Cl.
 CPC .......... *H03L 7/0805* (2013.01); *H03L 7/1974* (2013.01)
 USPC ............ 327/158; 327/149; 327/150; 327/159

(58) Field of Classification Search
 USPC .............. 327/141, 144–163; 331/1/A, 15–17; 375/373–376
 See application file for complete search history.

(56) References Cited

U.S. PATENT DOCUMENTS

| 7,394,418 | B2 * | 7/2008 | Eikenbroek ................... 341/143 |
| 8,223,050 | B2 * | 7/2012 | Matsumoto et al. .......... 341/131 |
| 2003/0174799 | A1 * | 9/2003 | Fahim ........................... 375/376 |
| 2008/0069286 | A1 | 3/2008 | Staszewski et al. |
| 2009/0212835 | A1 * | 8/2009 | Xu et al. ....................... 327/156 |
| 2009/0262877 | A1 | 10/2009 | Shi et al. |
| 2009/0302951 | A1 | 12/2009 | Ballantyne |
| 2011/0095925 | A1 * | 4/2011 | Matsumoto et al. .......... 341/143 |
| 2011/0193602 | A1 | 8/2011 | Adachi |

FOREIGN PATENT DOCUMENTS

CN    101803196    8/2010

OTHER PUBLICATIONS

International Search Report, dated Mar. 8, 2012, in corresponding International Application No. PCT/CN2011/075095 (2 pp.).
International Search Report, dated Mar. 8, 2012, in corresponding International Application No. PCT/CN2011/075095 (6 pp.).
Written Opinion of the International Searching Authority, dated Mar. 8, 2012, in corresponding International Application No. PCT/CN2011/075095 (4 pp.).

* cited by examiner

*Primary Examiner* — Brandon S Cole
(74) *Attorney, Agent, or Firm* — Staas & Halsey LLP

(57) ABSTRACT

An apparatus and method for reducing effects of spurs in a phased-locked loop having a sigma-delta modulator and digital circuits. The apparatus includes a clock dithering circuit coupled to each of the sigma-delta modulator and the digital circuits. Each clock dithering circuit is configured to dither flanks of a respective first and second clock input signal, and generate a dithered clock output signal, one for each of the sigma-delta modulator and digital circuits. A frequency of each dithered clock output signal follows a frequency of the respective first and second clock input signals, and a phase between each dithered clock output signal and the respective first and second clock input signal is shifted and constantly changing.

21 Claims, 3 Drawing Sheets

US 8,779,817 B2

SPUR SUPPRESSION IN A PHASE-LOCKED LOOP

CROSS-REFERENCE TO RELATED APPLICATIONS

This application is a continuation of International Application No. PCT/CN2011/075095, filed on Jun. 1, 2011, which is hereby incorporated by reference in its entirety.

BACKGROUND

The present disclosure generally relates to frequency control devices, and more particularly to spur reduction in a Phase-Locked Loop (PLL).

A phase-locked loop (PLL) circuit, as is generally known in the art, finds application where circuit synchronization is needed. In modern digital receivers, the phase-locked loop circuit may not be a hardwired implementation, but may rather be software, or microprocessor based implementation. The phase-locked loop will generally include three basic components. A phase detector, a loop filter and a voltage-controlled oscillator. As the incoming signal and the generated signal change with respect to each other, the phase difference or error is used as a time-varying signal into the loop filter. The loop filter generally governs the response of the phase-locked loop to the variations in the error signal. A well designed phase-locked loop will be able to track changes in the phase of the incoming signal, but will not be overly responsive to noise in the receiver.

The purity of the frequency output of an integrated phase-locked loop is an important factor in many applications. The clock used in the digital logic can couple through parasitics and surges to other parts of the phase-locked loop. These disturbances can result in spurious tones at the output of the phase-locked loop, also referred to herein as RF "spurs."

Spurs are generally reduced through the careful selection of phase-locked loop parameters, such as loop bandwidth, layout and signal routing. Differential logic can also be employed to reduce the ripple on the power or voltage supply lines. Spur reduction can also be achieved by shielding. However, the amount or spur reduction typically resulting from shielding is minimal. Reductions in the loop bandwidth are not preferable, as reducing the bandwidth can increase the lock time of the phase-locked loop and make it harder to integrate the loop filter. The contribution of noise from the voltage controlled oscillator can also increase.

Accordingly, it would be desirable to provide a system that reduces coupling induced spurs and addresses at least some of the problems identified.

BRIEF DESCRIPTION OF THE EMBODIMENTS

As described herein, the exemplary embodiments overcome one or more of the above or other disadvantages known in the art.

One aspect of the exemplary embodiments relates to an apparatus for reducing effects of spurs in a phased-locked loop having a sigma-delta modulator and digital circuits. In one embodiment, the apparatus includes a clock dithering circuit coupled to each of the sigma-delta modulator and the digital circuits. Each clock dithering circuit is configured to dither flanks of a respective first and second clock input signal, and generate a dithered clock output signal, one for each of the sigma-delta modulator and digital circuits. A frequency of each dithered clock output signal follows a frequency of the respective first and second clock input signals, and a phase between each dithered clock output signal and the respective first and second clock input signal is shifted and constantly changing.

In another aspect, the exemplary embodiments are directed to a method. In one embodiment, the method includes reducing frequency spur generation in an integrated phase locked loop with a sigma-delta modulator and digital logic by feeding a clock input signal into a delay line of N controllable delay cells. The clock input signal is divided into a set of M discrete phases. A total delay of the clock input signal through the delay line is adjusted so that an average delay through the M discrete phases is a function of a period of the clock input signal. A clock output signal is selected from an output of one of the N controllable delay cells, the clock output signal being phase shifted relative to the clock input signal. The selection of the clock output signal constantly changes the phase relative to the clock input signal, the clock output signal being provided to the sigma-delta modulator and digital logic.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Moreover, the drawings are not necessarily drawn to scale and that, unless otherwise indicated, they are merely intended to conceptually illustrate the structures and procedures described herein. In addition, any suitable size, shape or type of elements or materials could be used.

DETAILED DESCRIPTION OF THE EXEMPLARY EMBODIMENTS

Figure 2:
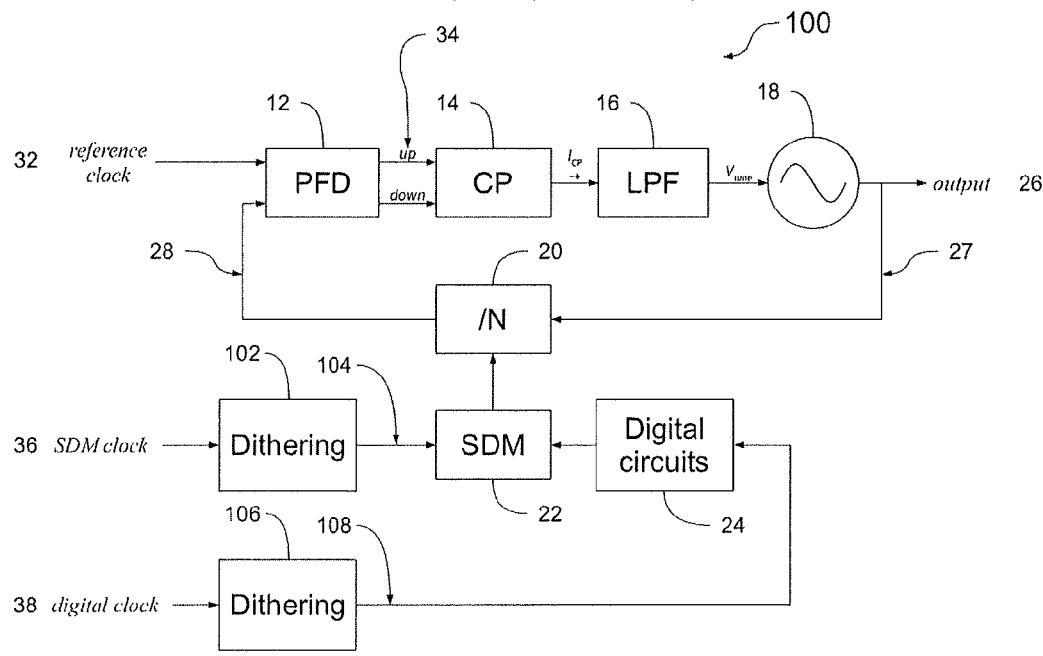
FIG. 2 is a block diagram of a system for spur reduction incorporating aspects of the disclosed embodiments.

FIG. 2 illustrates one embodiment of an apparatus for reducing the effects of spurs in a phased-locked loop having a sigma-delta modulator and digital circuits. The clock dithering block 102 is configured to dither flanks of a reference clock input signal 32 and generate a clock output signal 26, where a frequency of each clock output signal 26 follows a frequency of the reference clock input 32, and wherein a phase between each reference clock input signal 32 the respective clock output 26 is shifted and randomly changing.

Figure 1:
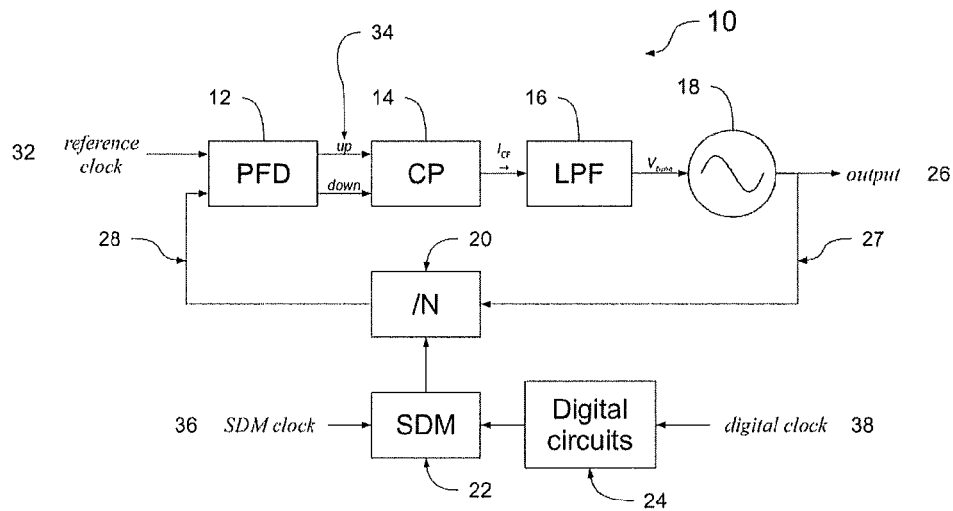
FIG. 1 is a block diagram of a typical phase-locked loop architecture of the prior art.

FIG. 1 illustrates one embodiment of an exemplary prior art phase-locked loop circuit 10. As shown in FIG. 1, the phase-locked loop circuit 10 includes a phase frequency detector (PFD) 12, a charge pump (CP) 14, a low-pass filter (LPF) 16, a voltage controlled oscillator (VCO) 18, a divider 20, a Sigma-Delta Modulator (SDM) 22 and digital logic circuitry 24.

The basic operation of the phase-locked loop circuit 10 of FIG. 1 is that a reference signal, or clock 32, is input to the phase frequency detector 12 along with a derivative of the output signal 26, which is fed back from the output of the voltage controlled oscillator 18 along the feedback loop 27 to the divider 20. The output 28 of the divider 20 is one of the inputs to the phase frequency detector 12, together with the reference clock signal 32. The phase frequency detector 12 will generate a phase error signal 34, which is generally proportional to the phase difference between the reference clock signal 32 and the output clock signal 26. In the example of FIG. 1, the phase error signal 34 is generally a positive "up" signal or a negative "down" signal, depending on whether the phase of the reference clock signal 32 leads or lags the divided phase signal 28 from the voltage controlled oscillator 18. Depending upon the amount of the phase difference, the phase error signal 34 will cause the charge pump 14 to increase or decrease the input $V_{tune}$ to the voltage controlled oscillator 18, after filtering by the low pass filter 16, until the phases are synchronized.

A clock signal 38 is used in the digital circuits 24, while a clock signal 36 provides the clock signal for the sigma delta modulator 22. The clocks of the system can generate or produce undesired spurious energy that propagates or is coupled into the circuits of the phase-locked loop 10, and is referred to herein as "spur energy." The current rush energy due to digital processing at the system clock rate or frequency can be upconverted into the RF spectrum, resulting in unacceptable RF spurs that are close in frequency to the carrier signal frequency.

FIG. 2 illustrates one embodiment of a device 100 that is configured to reduce the spur energy generated by, among other things, the digital circuits 24 and the sigma delta modulator 22. In one embodiment, as shown in FIG. 2, clock dithering blocks 102, 106 are inserted between the clock input signals 36, 38 and the sigma delta modulator 22 and digital circuits 24, respectively. Although the example of FIG. 2 shows the use of two separate clock dithering blocks 102, 106, in one embodiment, the clock dithering blocks 102, 106 can be integrated into, or comprise a single clock dithering block. The clock dithering blocks 102, 106 generally comprise delayed lock loop (DLL) circuits. Each delayed lock loop circuit of blocks 102, 106 is configured to dither the flanks of a clock input signal 36, 38, respectively, such that the frequency of the respective output clock signals 104, 108, follow the frequency of the clock input signal 36, 38. Each output clock signal 104, 108 is shifted in phase relative to the respective clock input signal 36, 38, and the phase shift is constantly changing in a random fashion. This provides at least two beneficial effects. Since many of the components of the phase-locked loop 100 shown in FIG. 2 are flank triggered, such as for example the phase frequency detector 12, the charge pump 14 and divider 20, these devices are sensitive to disturbances that occur during the rising and falling edges of their respective input signals. As the clock flanks of the sigma-delta modulator 22 are shifted in phase, they fall out of the time instances when they have the greatest effects on these components of the phase-locked loop 100. The disturbances that are still coupled in, or coupled to, non-flank triggered blocks, still have an instantaneous frequency, which is randomly changing. This causes the generated spur energy to spread over a much larger frequency range, which in effect, reduces the generated spur energy to a level where it does not pose a problem to the phase-locked loop circuit.

Figure 3:
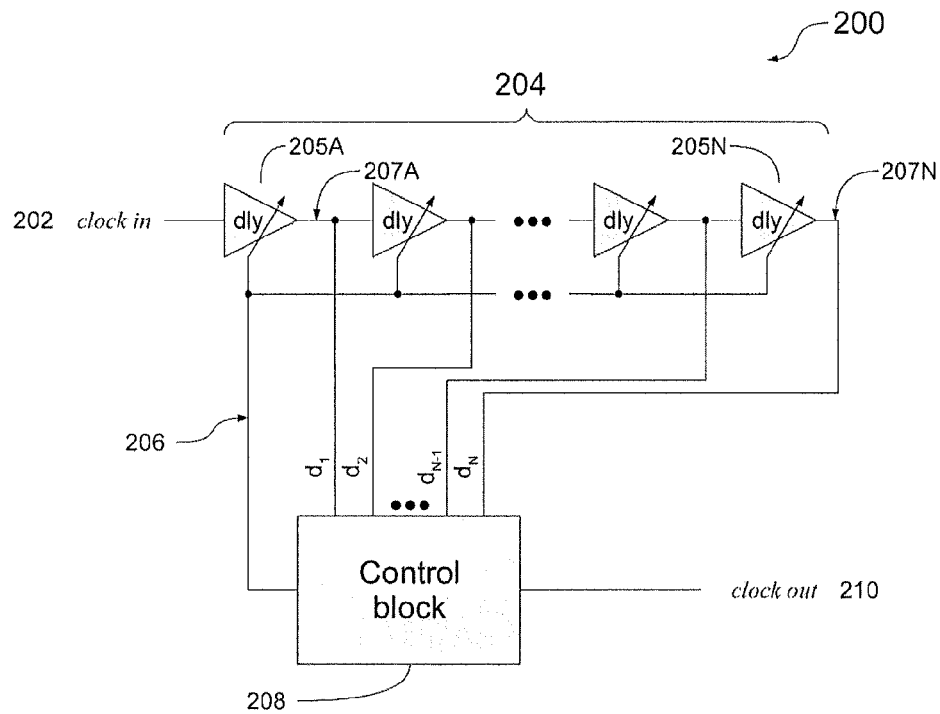
FIG. 3 is a block diagram of a DLL based clock dithering circuit for spur reduction in a system incorporating aspects of the disclosed embodiments.
Figure 4:
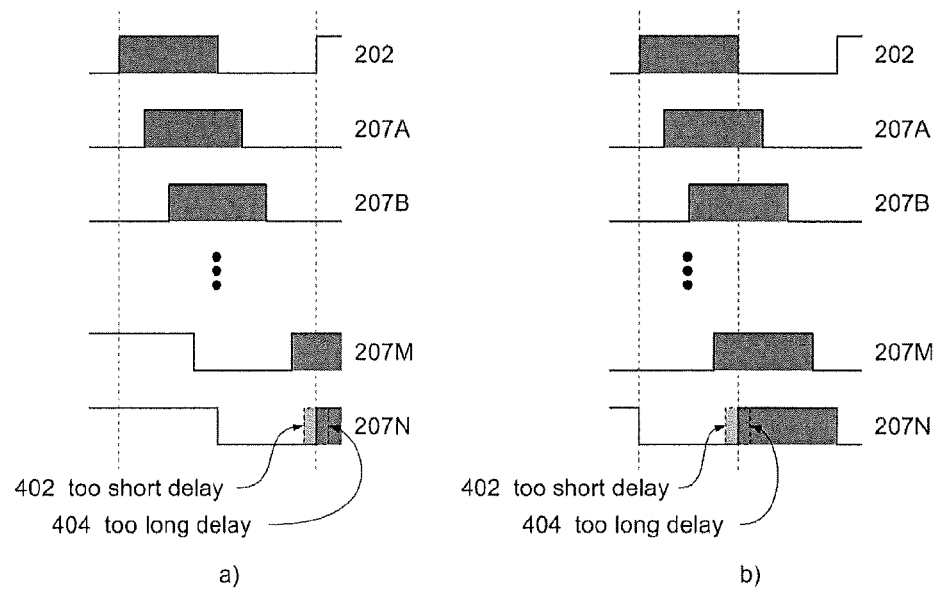
FIG. 4 is a diagram of the output of a DLL controlled delay line.

FIG. 3 illustrates one embodiment of a delayed lock loop (DLL) circuit 200 incorporating aspects of the disclosed embodiments. The delayed lock loop circuit 200 corresponds to each of the clock dithering blocks 102, 106. The delayed lock loop circuit 200 divides each input clock cycle of the clock input signal 202 into a set of M discrete phases or stages as is shown for example, in FIG. 4. Although the example of FIG. 2 shows two clock dithering blocks 102, 106, the example of FIG. 3 will be described with respect to a single delayed lock loop circuit 200, which can be applied to either of clock dithering blocks 102, 106. The delay lock loop circuit 200 is generally a spur reduction circuit. In one embodiment, the clock input signal 202 is fed to a delay line 204 that is made up of N delay cells, generally identified as 205A-N. With reference to FIG. 2, in one embodiment, the clock input signal 202 comprises the clock input signal 36 to the sigma delta modulator 22 or the clock input signal 38 to the digital circuits 24. The total amount of the delay provided by the delay line 204 is variable and controlled by a DLL control block 208 through the control signal 206. The control signal 206 can be either a digital control word or an analog voltage or current. The output 207A-207N of each delay cell 205A-205N, respectively, is coupled to the control block 208, where the inputs to the control block 208 are referenced as $d_1, d_2 \ldots d_{N-1}, d_N$.

The control block 208 is generally configured to set the control signal 206 such that the average delay through the first M stages of the delay line 204 equals one period of the clock input signal 202 as shown in FIG. 4a. In an alternative embodiment the control block 208 is configured to set the control signal 206 such that the average delay through the first M stages of the delay line 204 equals half a period of the clock input 202 as shown in FIG. 4b. The DLL circuit 200 is configured to divide the input clock signal 202 into N phases such that at least one of the phases occur at a time instance when none of the edge triggered blocks of the PLL 100 are active.

In one embodiment the control block 208 is configured to use a value of M=N so that the clock input signal 202 is divided into a fixed number of phases. In an alternative embodiment the control block 208 chooses the number M≤N in a random fashion such that the clock input signal 202 is divided into a randomly varying number of phases.

In one embodiment the control block 208 is configured to constantly select one of the outputs 207A-207N as the clock output 210. In an alternative embodiment the control block 208 is configured to select one of the outputs 207A-207N in a random fashion as the clock output 210.

Figure 5:
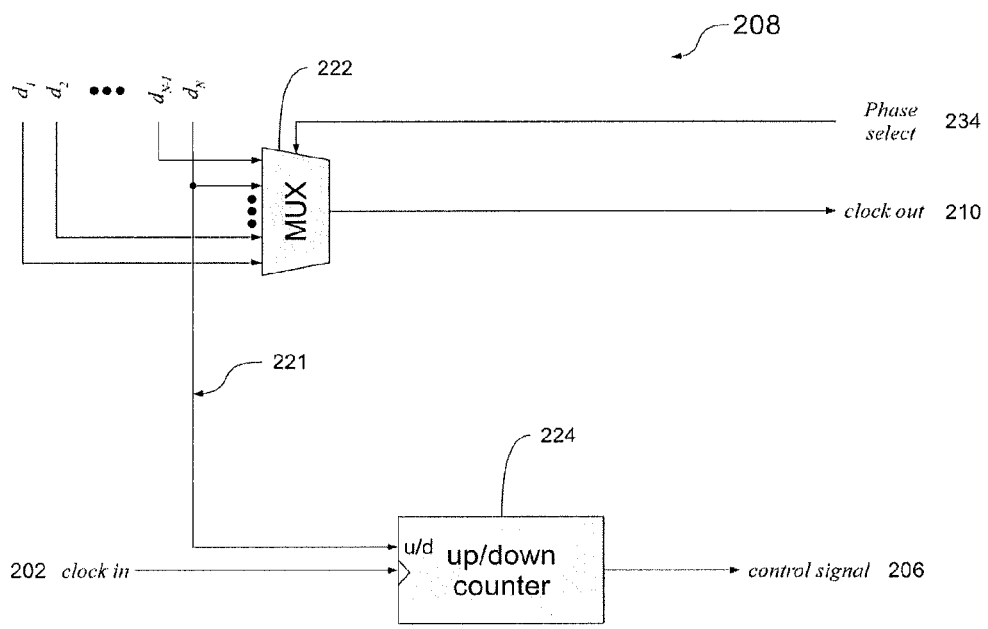
FIG. 5 is a block diagram of a control block for a system incorporating aspects of the disclosed embodiments.

FIG. 5 illustrates one embodiment of the control block 208 of FIG. 3 where the delay line 204 comprises digitally controlled delay cells. In this example, the control block 208 from FIG. 3 includes an N-bit multiplexer 222 and an up/down counter 224. The N-bit multiplexer 222 is coupled to each of the delay cell outputs, $d_1, d_2 \ldots d_{N-1}, d_N$. The output 221 of the last delay cell $d_N$ is connected to the up/down control input 221 of the counter 224. If the delay through the delay chain 204 is too short, as shown by edge 402 in FIGS. 4a and 4b, the up/down signal on the control input 221 is high and the counter 224 will count up, increasing the delay. If the delay signal through the delay chain 204 is too long, as shown by edge 404 in FIGS. 4a and 4b the up/down signal on the control input 221 will be low and the counter 224 will count down, decreasing the delay. The control signal 206 will enter a limit cycle such that the average delay through the delay line 204 is one input clock cycle, whereas the instantaneous delay will have a small variation.

The MUX 222 routes one of the delay cell outputs 207A-207N of FIG. 3 to the clock output 210 as controlled by the phase select signal 234. The phase select signal 234 is chosen such that the rising or falling edge of the clock output 210 does not coincide with the rising or falling edge of the clock input 202 or any other flank in the PLL 100. The instantaneously changing delay through the delay line 204 causes the flank of the clock output 210 to be dithered.

Figure 6:
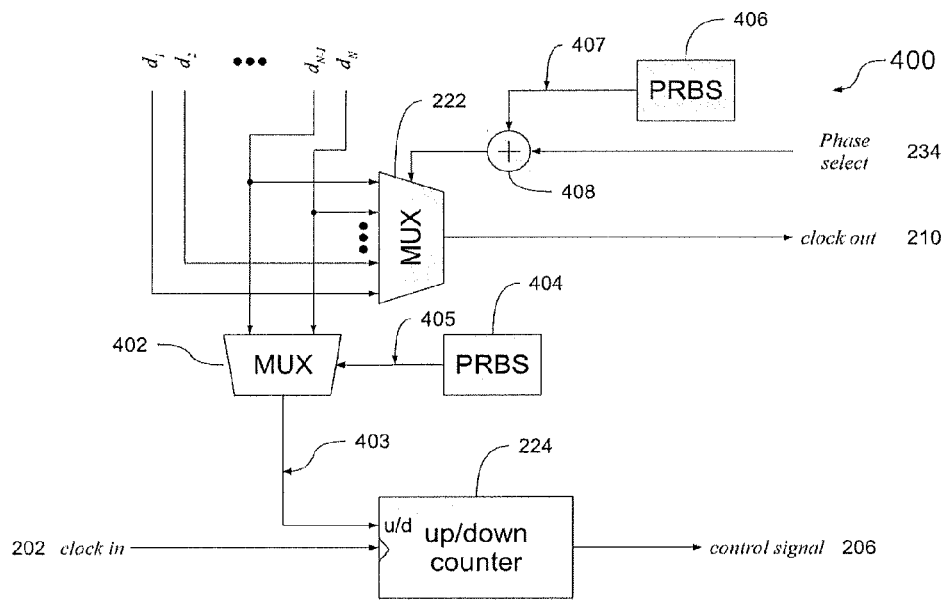
FIG. 6 is a block diagram of a control block for a system incorporating further aspects of the disclosed embodiments.

FIG. 6 illustrates an alternative embodiment of the control block 208 of FIG. 3. In this embodiment, the control block 208 includes two pseudo random bit sequence (PRBS) generators 404 and 406, an additional 2-bit MUX 402 and an adder 408. The MUX 402 selects the number of delays M during one input clock cycle in a random fashion by means of the PRBS signal 233. The selected signal 403 is used to control the up/down input of the counter 224. This adds additional dithering to the output clock signal 210.

The adder 408 adds an offset to the phase select signal 234 by means of the PRBS signal 407. This adds additional dithering to the clock output signal 210.

The aspects of the disclosed embodiments advantageously provide a smaller, power efficient and primarily digital phase-locked loop circuit, making it easier to implement in integrated circuits. Apart from the delay line 204 shown in FIG. 3, the delay lock loop circuit 200 can be implemented in digital logic. The delay lock loop circuit 200 only needs to be robust enough to lock all the input frequencies, which is easily achieved while maintaining a low current consumption. Most of the operations of the circuit 208, shown in FIG. 5 and FIG. 6 can be configurable, such as for example the phase select 234, 2-bit multiplexer 402 dithering and N-bit multiplexer 222 dithering. The clock dithering can easily be bypassed altogether or the delay line 204 of FIG. 3 can be made manually controllable. These are all options for debugging and testability that make the circuit 200 very flexible and easy to implement. A pseudo random bit sequence generator is typically found in the sigma delta modulator 22, and can be reused in the control block circuit 208 without loss of performance.

An additional benefit of the delay lock loop circuit 200 of FIG. 3 is that the circuit can output several clocks of different phase so that supply line noise can be spread over the whole input clock period.

Although the aspects of the disclosed embodiments are generally described herein with respect to a phase locked loop, that aspects of the disclosed embodiment are not so limited. In alternate embodiments, the delay lock loop circuit of the disclosed embodiments can be implemented in other situations where spurious tones and disturbances from digital logic and clock lines are a problem.

The aspects of the disclosed embodiments generally provide for the reduction of spurs in a phase locked loop. A delay locked loop circuit is implemented in a clock dithering block and is used to reduce the spur energy at the source. A control block is used to delay the clock input signal by advantageously reducing the spur energy at the source, so that shielding sensitive parts of the phase-locked loop becomes easier. The delay lock loop circuit of the disclosed embodiments is advantageously smaller, power efficient and primarily digital, making it easier to implement in integrated circuits.

Thus, while there have been shown and described and pointed out fundamental novel features of the invention as applied to the exemplary embodiments thereof, it will be understood that various omissions and substitutions and changes in the form and details of devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention.

Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An apparatus for reducing effects of spurs in a phased-locked loop circuit, the apparatus comprising:
   a sigma-delta modulator coupled to the phase-locked loop circuit;
   digital circuits coupled to the sigma delta modulator;
   a clock dithering circuit coupled to each of the sigma-delta modulator and the digital circuits, each clock dithering circuit being configured to dither flanks of a respective first and second clock input signal, and generate a dithered clock output signal, one for each of the sigma-delta modulator and digital circuits; and
   wherein a frequency of each dithered clock output signal follows a frequency of the respective first and second clock input signals, and a phase between each dithered clock output signal and the respective first and second clock input signal is shifted and constantly changing.

2. The apparatus of claim 1, wherein the clock dithering circuit comprises:
   a delay line comprising one or more controllable delay cells, the delay line configured to receive a clock input signal and divide the clock input signal into a set of M discrete phases.

3. The apparatus of claim 2, wherein the clock dithering circuit further comprises:
   a control block coupled to an output and a delay control input of each controllable delay cell in the delay line, the control block being configured to adjust a delay of the delay line so that a total delay through a first M phases of a total number N of the controllable delay cells is a function of a period of the clock input signal.

4. The apparatus of claim 3, wherein the control block comprises:
   a multiplexer coupled to the output of each controllable delay cell; and
   a counter coupled to an output of a last delay cell in the delay line, the counter configured to generate the delay control signal that is configured to increase or decrease an amount of the delay based on a comparison of a period of the output of the last delay cell to the clock input signal.

5. The apparatus of claim 3, wherein the control block is configured to select the number of M discrete phases to be a fixed number less than or equal to the total number N of delay cells.

6. The apparatus of claim 3, wherein the control block is further configured to select the number of M discrete phases to be a randomly varying number less than or equal to the total number N of delay cells.

7. The apparatus of claim 3, wherein the total delay through the first M phases in the delay line is substantially equal to one input clock period of the clock input signal.

8. The apparatus of claim 3, wherein the total delay through the first M phases in the delay line is substantially equal to one-half of an input clock period of the input clock signal.

9. The apparatus of claim 3, wherein the control block is further configured to select an output of the one or more controllable delay cells as a clock output signal.

10. The apparatus of claim 9, wherein the control block is configured to select the output of one of the one or more controllable delay cells as the clock output signal in a random fashion.

11. The apparatus of claim 1, wherein the clock dithering circuit is a delay lock loop circuit.

12. A method of reducing frequency spur generation in an integrated phase locked loop with a sigma-delta modulator and digital logic, the method comprising:
 feeding a clock input signal into a delay line of N controllable delay cells;
 dividing the clock input signal into a set of M discrete phases;
 adjusting a total delay of the clock input signal through the delay line, wherein an average delay through the M discrete phases is a function of a period of the clock input signal;
 selecting a clock output signal from an output of one of the N controllable delay cells, the clock output signal being phase shifted relative to the clock input signal, the selection of the clock output signal constantly changing the phase shift relative to the clock input signal, the clock output signal being provided to the sigma-delta modulator and digital logic.

13. The method of claim 12, wherein the total delay provided by the delay line is equal to one-half of a period of the clock input signal.

14. The method of claim 12, wherein the total delay provided by the delay line is equal to one period of the clock input signal.

15. The method of claim 12, further comprising:
 dividing a period of the clock input signal into M discrete phases, wherein M is fixed.

16. The method of claim 12, further comprising:
 dividing a period of the clock input signal into M discrete phases, wherein M is randomly selected.

17. The method of claim 12, further comprising:
 selecting an output of one of the M discrete phases as the output clock signal.

18. The method of claim 12, further comprising:
 randomly selecting an output of one of the M discrete phases as the output clock signal.

19. The method of claim 12, comprising adjusting the total delay through the delay line by monitoring an output of an M'th discrete phase in the delay line, determining if the output of the M'th discrete phase corresponds to a desired delay, and increasing or decreasing the total delay through the delay line in dependence of the output of the M'th discrete phase.

20. The method of claim 12, comprising a phase select signal that is used to route one of the outputs of the controllable delay cells to the clock output, the phase select signal being selected so that a rising or falling edge of the clock output signal does not coincide with a rising or falling edge, respectively, of the clock input signal or other signals in the phase-locked loop circuit.

21. An apparatus reducing effects of spurs in a phased-locked loop, the apparatus comprising:
 a sigma-delta modulator coupled to the phase-locked loop;
 digital circuits coupled to the sigma delta modulator; and
 clock dithering circuits coupled to each of the sigma-delta modulator and the digital circuits, respectively, each clock dithering circuit configured to dither flanks of a respective first and second clock input signal, and to generate a dithered clock output signal, one for each of the sigma-delta modulator and digital circuits,
 wherein a frequency of each dithered clock output signal follows a frequency of the respective first and second clock input signals, and a phase between each dithered clock output signal and the respective first and second clock input signal is shifted and constantly changing.

* * * * *